(12) United States Patent
Micheloni et al.

(10) Patent No.: US 6,603,681 B2
(45) Date of Patent: Aug. 5, 2003

(54) METHOD OF PULSE PROGRAMMING, IN PARTICULAR FOR HIGH-PARALLELISM MEMORY DEVICES, AND A MEMORY DEVICE IMPLEMENTING THE METHOD

(75) Inventors: Rino Micheloni, Turate (IT); Andrea Sacco, Alessandria (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/002,599

(22) Filed: Oct. 31, 2001

(65) Prior Publication Data

US 2002/0122340 A1 Sep. 5, 2002

(30) Foreign Application Priority Data

Oct. 31, 2000 (IT) .......................................... MI00A2367

(51) Int. Cl.[7] .............................. G11C 16/04; G11C 7/00
(52) U.S. Cl. ............................. 365/185.19; 365/189.09; 365/203

(58) Field of Search ....................... 365/185.19, 230.06, 365/203, 189.08, 189.09, 45, 185.03, 104, 103

(56) References Cited

U.S. PATENT DOCUMENTS 5,815,425 A  *  9/1998  Wong et al. .................... 365/45
5,940,322 A  *  8/1999  Atsumi ................... 365/185.18

* cited by examiner

*Primary Examiner*—Thong Le
(74) *Attorney, Agent, or Firm*—Lisa K. Jorgenson; Robert Iannucci; Seed IP Law Group PLLC

(57) ABSTRACT

A pulse programming method for a non-volatile memory device includes: addressing memory cells to be programmed within the device by selecting corresponding hierarchic decoder transistors; biasing the gate terminals of the memory cells; and programming the memory cells by applying a voltage pulse, regulated by a bias circuit, to the drain terminals of the memory cells. Advantageously, the programming method further comprises a step of precharging an internal node of the bias circuit before starting the programming step, the internal node being connected to a parasitic capacitance of the memory device.

18 Claims, 9 Drawing Sheets

METHOD OF PULSE PROGRAMMING, IN PARTICULAR FOR HIGH-PARALLELISM MEMORY DEVICES, AND A MEMORY DEVICE IMPLEMENTING THE METHOD

BACKGROUND OF THE INVENTION

1. Field of the Invention

The present invention relates to a method of pulse programming, in particular for memory devices exhibiting a high parallelism.

The invention also relates to a device implementing the method.

The invention relates, particularly but not exclusively, to a non-volatile memory, and the detailed description that follows will make reference to this field of application for convenience of explanation only.

2. Description of the Related Art

As is well known, in a memory device that uses floating-gate MOS transistors as basic memory cells, the threshold voltage of the floating-gate transistor is modulated in order to discriminate between two logic states, namely: a state where the floating gate contains no charge and that is characteristic of a UV-erased cell (corresponding to a stored logic "1"); and a state where the floating gate contains a sufficient number of electrons to raise the threshold level, thus indicating a programmed cell condition (corresponding to a stored logic "0").

To read from a memory cell 1, a current reading method may be used by applying a read voltage Vread to the control gate terminal of the cell and reading the current that flows through the cell:

if the cell is written, its threshold voltage will be higher than the read voltage Vread, and no current is flowing through the cell;

if the cell is erased, its threshold voltage is adequate to allow a current flow.

The probabilistic distribution of the threshold voltages of memory cells, and their digital equivalence, are shown schematically in FIG. 1A for of a two-level EEPROM Flash cell.

To read information from memory cells of this type, a sense amplifier is used to compare the cell current with a reference current value and to convert the analog information of the addressed data contained in the cell (i.e. the threshold voltage value of the cell) into a digital form (i.e. a logic "0" or "1").

Non-volatile multilevel memories have recently made their appearance on the market, these being memories where plural information bits can be stored in each cell. In memories of this kind, the charge contained in the floating gate is further split into a number $2^{nb}$ of distributions, where "nb" is the number of bits to be stored into a single cell. For example, where two bits per cell are provided, the sense amplifier must deal with four distributions instead than two distributions as in the two-level case, as shown schematically in FIG. 1B for a two bits multilevel EEPROM Flash cell.

It should be noted that the working range of the threshold voltage is unrelated to the number of bits that a cell is to contain. Using a multilevel structure involves, therefore, a reduction of the distances separating the various distributions threshold-wise.

Reducing the distances between the threshold voltage distributions means reducing the current differences that the sense amplifier must sense. Moreover, a specific programming method must be used for setting the cells within the different voltage distributions.

The exemplary instance of a NOR architecture Flash EEPROM will be considered here below for simplicity.

As is well known, memory cells of this kind are written by hot electron injection, by applying a 10 V potential to the control gate terminal, a 5 V potential to the drain terminal and by connecting the source terminal to a ground reference, the floating gate terminal is allowed to store charge up to its saturation state.

In a multilevel memory, because of the reduced differences between the threshold voltages that correspond to the various charge levels that the floating gate terminal can accept, and to the differences between the various conduction levels of the cells, the cell programming phase requires a great accuracy control, and especially a control of the charge stored into the floating gate terminal during that programming phase.

It has been shown, both in theory and experimentally, that a linear relation exists between the variation $\Delta VG$ of the voltage applied to the control gate terminal during the cell programming phase and the threshold jump obtained at set values of both the voltage VD applied to the drain terminal and the voltage VS applied to the source terminal, as discussed by Riccò et al. in an article "Nonvolatile Multi-level Memories For Digital Application", Pro. IEEE, December 1998, vol. 86, pages 2399–2421.

As shown schematically in FIG. 2, the cell should be programmed by applying a linearly increasing voltage to its control gate terminal.

In practice, using a series of program pulses which vary by a constant value $\Delta VG$ is equally advantageous. The programming voltage would be here a constant-pitch stepped ramp.

It can be appreciated that a distribution of the threshold voltage having a width $\Delta VG$, i.e. the same pitch as the stepped programming voltage, can be obtained by the above programming method.

In that way, multilevel memory cells can be programmed using a desired threshold voltage value and a minimum number of program pulses.

A major problem is that the above cell programming method is inherently a slow one: a succession of pulses must be applied to the control gate terminal of the cell, which takes longer than the single program pulse supplied to two-level cells.

In order to achieve a single byte program time comparable with that of a conventional two-level cell, it has been used programming in parallel several multilevel cells.

If the programming time a single byte is 8 µs in the two-level case, and it takes 200 µs to run the full programming steps in the multilevel case, then an effective programming time of 6 µs per byte in multilevel cells can only be obtained by simultaneously programming 256 bits in multilevel cells.

This results in an increased internal parallelism of multilevel memory devices thus raising problems with their internal configurations.

Well employed by commercially available devices is the synchronous reading mode (burst mode), in order to improve the transfer of data between the memory and the host system. The term "synchronous" originates from that the data is to be output synchronously with an external clock signal. The frequency of the clock signal usually exceeds that for the asynchronous access time. The clock signal frequency lies usually in the 50 MHz range, whereas the access time of memory devices is in the 100 ns (10 MHz) range. It's thus necessary to read internally a much longer binary word than the output word, so as to create a "buffer" for different periods of the clock signal.

To increase the size of the internal word means to increase the number of bits that must be read in parallel, and therefore, the number of sense amplifiers in the memory device.

Thus, there is a demand for memory architectures featuring high parallelism at the reading and programming phases. The demand is even more pressing where multilevel memory devices are concerned.

Shown in FIG. 3 is a typical architecture for a non-volatile memory 1. In particular, the memory array comprises a number of sectors 2 divided into two groups, A and B. Each group has a row decoder 3A, 3B and a sense amplifier array 4A, 4B of its own (SA<0> ... SA<7>).

In the architecture shown, there are eight sense amplifiers, to communicate a binary word of one byte (eight bits) to the outside world. The sense amplifier arrays 4A, 4B are enabled exclusively according to which part (either A or B) of the memory array is to be read or programmed. The digital outputs from the sense amplifiers are passed into a multiplexer 5 for routing to the output pads.

Actually, although there are eight bits to be read, as many as sixteen sense amplifiers have been connected in order to limit the parasitic load seen by them from the bit-line side.

Assume that 64 cells are to be read in parallel. Proceeding by the above technique would be difficult because doubling the number of sense amplifiers means adding as many as 64 elements within the step of two sectors 2; or quadruplicating them within the step of a single sector as shown in FIG. 4.

Thus, the sectorized memory architecture 6 shown in FIG. 4 is used for high-parallelism devices. In this case, each set 4 of sense amplifiers are shared by all the sectors, so that their number can be restricted to 64 and they can be patterned within the step of four sectors.

However, the architecture 6 has an extended bit-line, since the sense amplifiers are located far from the sectors. Also, it comprises a plurality of column decoders 7 connected by a line COLOUT.

In particular, the line COLOUT will take the corresponding outputs from all the column decoders 7 to the relevant sense amplifiers. Each sectors column generates 64 outputs through the column decoder 7, and the line COLOUT connects in particular all the last outputs <63>, as shown in FIG. 4.

A multiplexer (not shown because conventional) is incorporated into the column decoder that must select just the outputs from the sectors column that contains the selected memory location.

It should be noted that, when the sense amplifiers are so distributed and shared by the whole memory array, the bit-lines become of necessity long and introduce significant parasitic capacitance (about 3 to 4 pF for each bit-line) in the memory architecture, taking into account even the line COLOUT connecting the bit-line to its corresponding sense amplifiers.

The increased parasitic load on the bit-line obviously reflects on the sensing circuit and the programming method of the architecture.

In a memory device that is characterized by high parallelism at the programming phase it's of the utmost importance arranging a strong current draw during the program pulse. This current is to be supplied at constant voltage since the programming phase proceeds by augmenting the voltage at the control gate terminal but maintaining the drain terminal voltage fixed.

FIG. 5 shows generally a bias circuit 10 for the drain terminal of a non-volatile memory cell in schematic form.

The programming voltage VPP may be generated internally using voltage boosters, or supplied by an external supply source.

The bias circuit 10 comprises a drain regulator 11 connected between an output terminal of a programming voltage reference VPP and the drain terminal D of a memory cell CM.

The drain regulator 11 supplies a regulated voltage VPD to a series of enable transistors comprising first PL, second YM, third YN and fourth YO MOS transistors connected between an output terminal O11 of said drain regulator 11 and the drain terminal D of the cell CM.

In particular, the first transistor PL is a P-channel MOS transistor having its source terminal connected to the output terminal O11 of the drain regulator 11 and its drain terminal connected to the line COLOUT of the column decoders, represented here by its capacitive load CPAR1 connected to ground. The first transistor PL is the select transistor, denoted PROGRAM LOAD, and has its gate terminal connected to a first high-voltage switch HVSW1 being applied the regulated voltage VPD and input an enable signal ENABLE_PL_N.

The transistors YM, YN and YO are hierarchic decoder transistors, and have their gate terminals connected to high-voltage switches HVSW2, HVSW3 and HVSW4, respectively; the switches being applied a regulated decoder voltage VPCY and connected to the input of a binary decoder 12. The hierarchic decoder is represented here by its capacitive load CPAR2, which is connected between a circuit node XY, intermediate the decoder transistors YM and YN, and ground GND.

The binary decoder 12 is applied a rated supply voltage VDD to the memory device and is input the column addresses ADDC of the data to be programmed.

It should be noted that the select or program load transistor PL allows the various outputs to be programmed separately, with the regulated voltage VPD being supplied to all the program loads in the memory device. Each Program Load PL has an enable signal ENABLE_PL_N in all cases.

When the regulated voltage VPD is to be taken to the column decoder, the enable signal ENABLE_PL_N of the Program Load PL is brought to a low logic state. The column decoder transistors YM, YN and YO are operated through the high-voltage switches HVSW2, HVSW3 and HVSW4, which are applied the voltage VPCY. During the programming phase, this voltage VPCY is brought approximately to 10 V to minimize the voltage drop across the column decoder.

As to time, the time duration of a single program pulse is on the order of one $\mu$s, so that to open a time window of definite width, the drain voltage value of the cell must be switched within 100 ns or less.

In the instance of a multilevel device as discussed above, the time duration of the program pulse and the voltage applied to the cell drain are specially critical parameters to successful programming.

Typically in a ladder programming mode, a memory cell draws a current of several tens $\mu$A; assuming a current draw of 50 $\mu$A per cell and 64 cells programmed in parallel, it is found that the overall current would be 3.2 mA during the programming phase.

Let us see now in further detail how the single pulse application, a so-called program pulse, is enabled.

For reliability reasons, the value of the cell gate voltage is set first, and the drain voltage is applied next starting with a discharged bit-line. This means that, when the drain terminal of the cell is to be brought to a voltage level of 5 V, the parasitic capacitances CPAR1 and CPASR2 of FIG. 5, i.e. the parasitic capacitances respectively associated with the node COLOUT and the bit-line itself, require to be charged simultaneously.

In a typical instance of 64 lines COLOUT and a total parasitic capacitance (CPAR1+CPAR2) of 4 pF, a total load of 256 pF would have to be charged to 5 V from ground potential during the rising edge of the program pulse. The capacitive charge current, assuming a rising edge of 100 ns and a drain voltage of 5 V, would be given as:

$$I_{charge} = \frac{256*10^{-12}*5}{100*10^{-9}}A = 1.28\,mA$$

In other words, a current is obtained of the same order of magnitude as that actually needed for programming the cells. Obviously, the capacitive load depends on the number of cells. It must be noted that the influence of the capacitive charge current grows inversely as the time allowance for the rise transient of the program pulse.

The combined effects of turning on the cells and charging the parasitic capacitances associated with the bit-lines on the current draw during the transient make it so large that the regulator output voltage is seriously affected. If the regulator cannot be restored to the rated voltage value within 100 ns, or if the node VPP cannot supply the required current, the setting of the program pulse duration becomes less than optimal and significantly dependent on the number of cells to be programmed.

The resultant transient is illustrated by FIG. 6, where the drain terminal of a cell being programmed is shown to quickly attain the value of the regulated voltage VPD; however, that value is reached with a time constant that is proportional to the capacitive load.

Thus, it's very hard defining this program pulse in the presence of high capacitive loads such that the programming phase can proceed correctly within predetermined time limits.

One object of the present invention is to provide a method of pulse programming memory cells overcoming the foregoing limitations and obviating the shortcomings of the prior art.

BRIEF SUMMARY OF THE INVENTION

An embodiment of the present invention is directed to a pulse programming method for a non-volatile memory device, comprising the steps of:
  addressing the memory cells to be programmed in said device by selecting a corresponding program load transistor and a series of hierarchic decoder transistors of a bias circuit;
  biasing the gate terminals of said memory cells;
  precharging an internal node of said bias circuit connected to a parasitic capacitance of said memory device; and
  programming said addressed memory cells by applying a regulated voltage pulse to the drain terminals of said memory cells.

In other words, the method provides a precharging phase of a substantial portion of the parasitic capacitance associated to the bit-line before performing the actual programming phase.

Furthermore, this programming method can be applied to a memory device by modifying the structure of the column decoder drivers, i.e. by modifying the design of the drivers of the column decoder selectors YM to afford switching in a high-voltage and low-consumption condition.

Another embodiment of the invention further relates to a memory device, comprising at least a bias circuit for biasing a drain terminal of non-volatile memory cells and including:
  a column decoder portion, connected between a regulated voltage reference and said drain terminal, comprising a program load transistor and a series of hierarchic decoder transistors, all said transistors having their gate terminals connected to respective drive switches;
  a parasitic capacitance connected to a common node between said program load transistor and the first of said hierarchic decoder transistors in said column decoder portion;
  a binary decoder having a signal input and a plurality of outputs, one for each corresponding drive switches;
  a precharge circuit connected between one output of said binary decoder and said first hierarchic decoder transistor and receiving a suitable precharge signal to start a precharge phase of said parasitic capacitance.

The features and advantages of the pulse programming method and the memory device according to the invention will be apparent from the following detailed description of embodiments thereof, given as non-limiting examples with reference to the accompanying drawings.

DETAILED DESCRIPTION OF THE INVENTION

Figure 7:
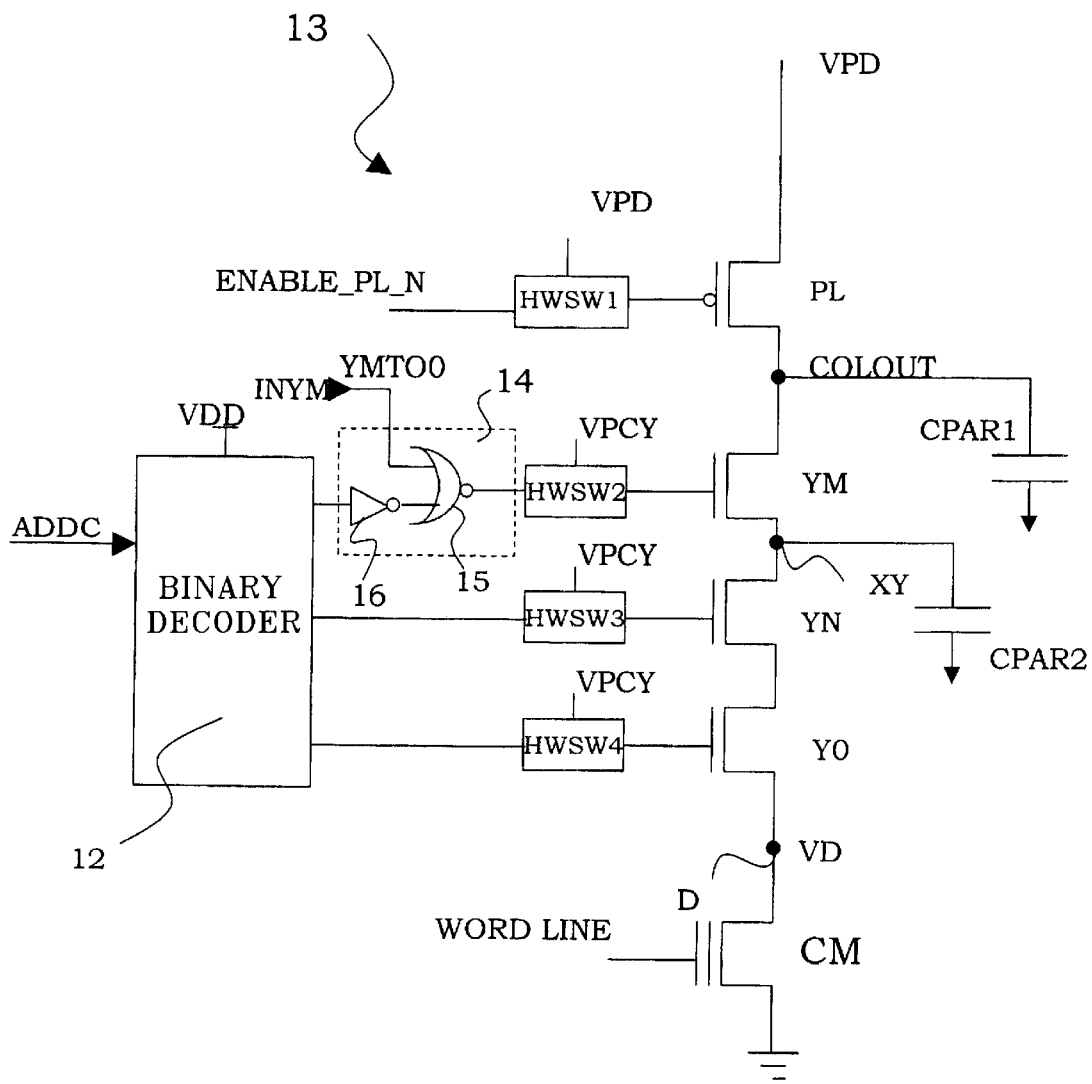
FIG. 7 shows schematically a bias circuit for the drain terminal of a non-volatile memory cell implementing the programming method of this invention.

With reference to the drawing views, in particular to FIG. 7, a bias circuit for the drain terminal of a memory cell is shown generally at 13 and described here below.

Figure 1A:
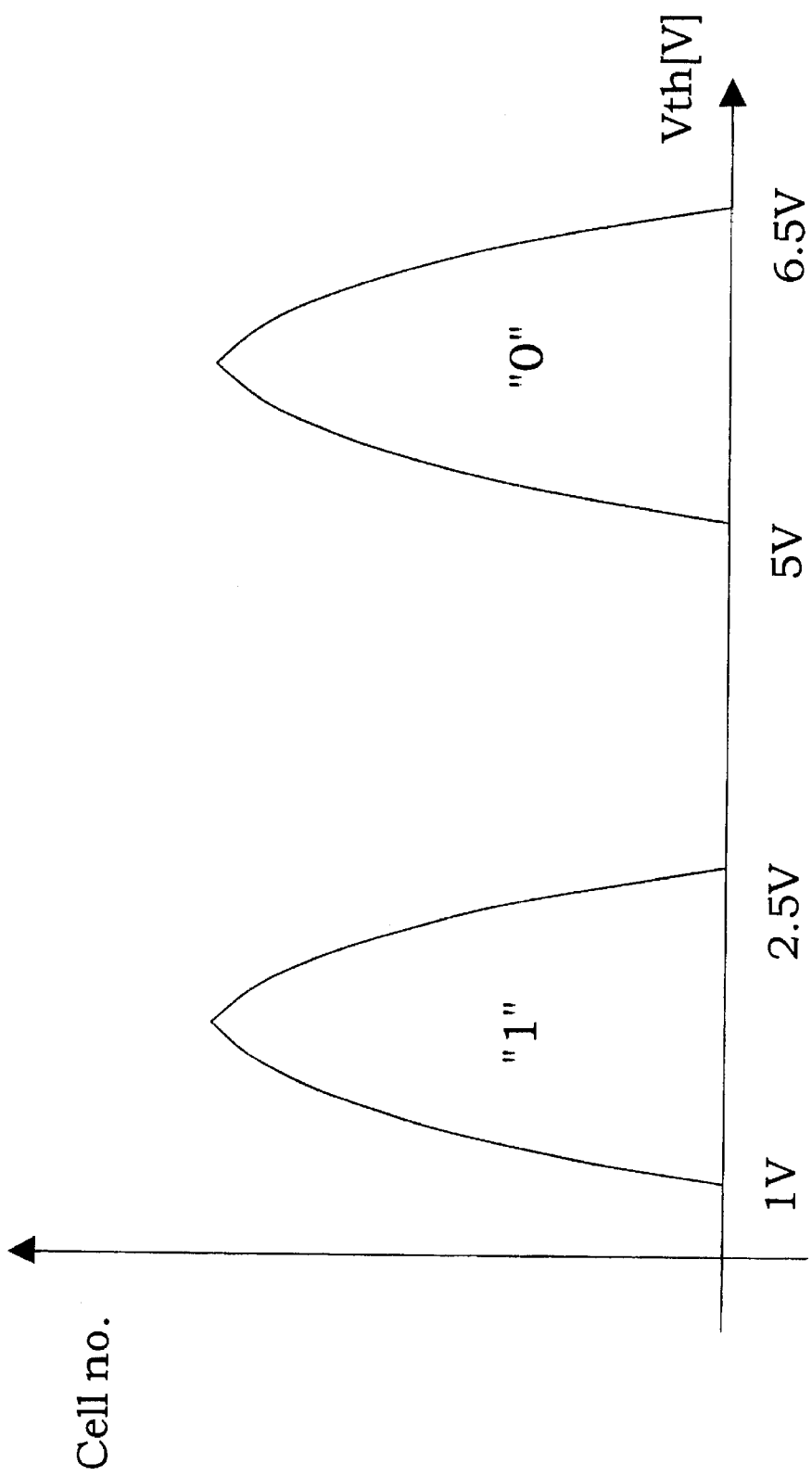
FIG. 1A shows schematically a probabilistic distribution of the threshold voltages of memory cells in the two-level instance.
Figure 1B:
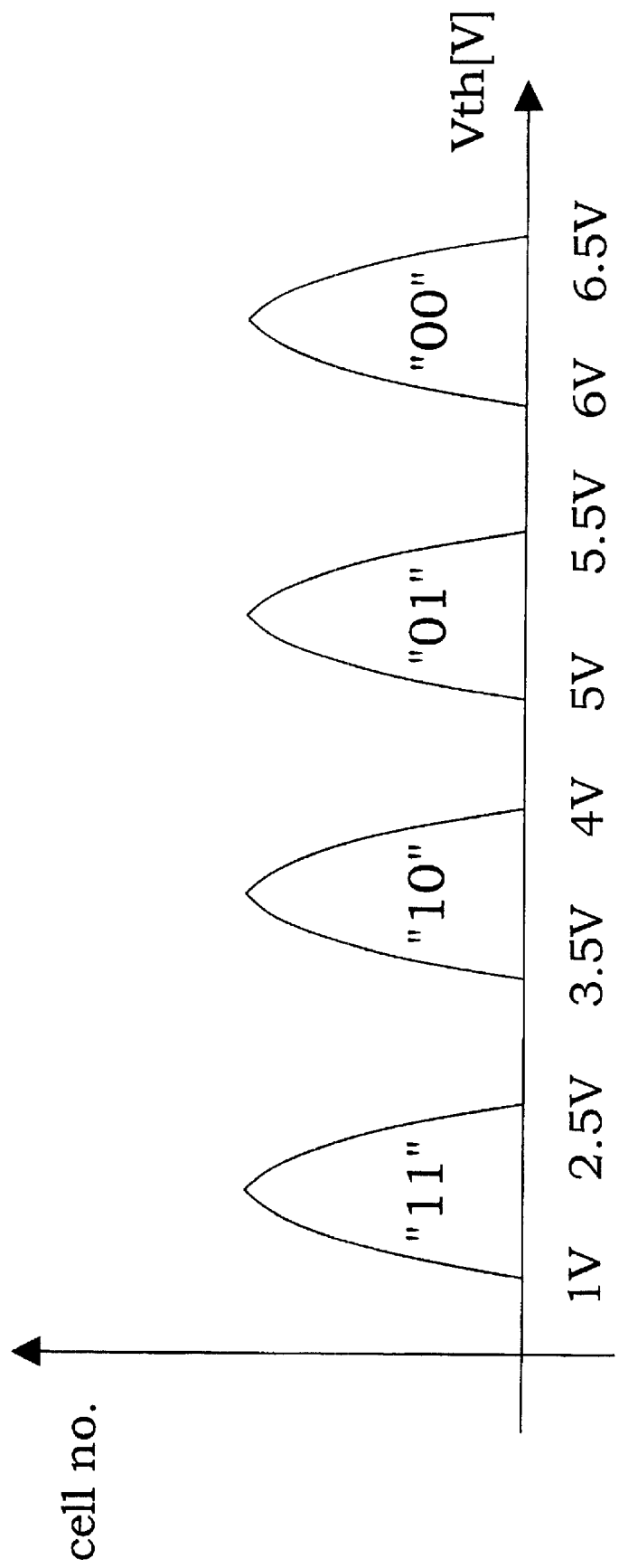
FIG. 1B shows schematically a probabilistic distribution of the threshold voltages of memory cells in the multilevel instance.
Figure 2:
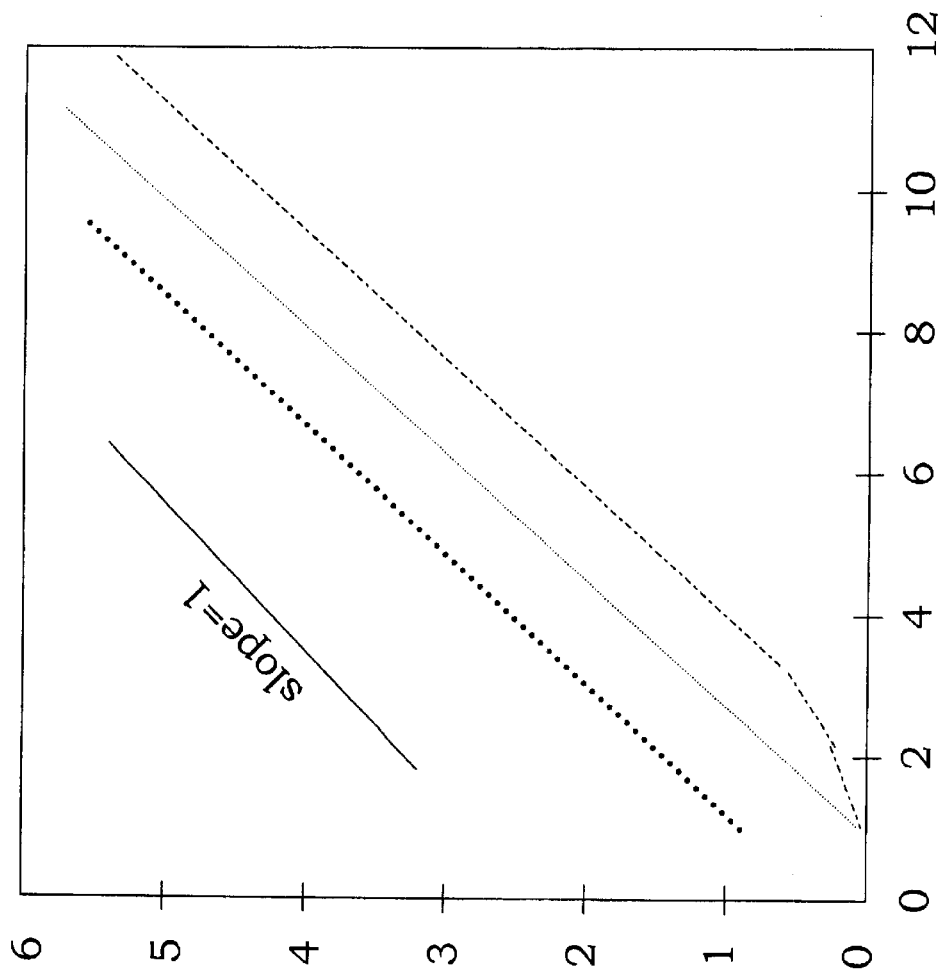
FIG. 2 shows schematically the pattern of a programming voltage for application to the gate terminal of a memory cell.
Figure 3:
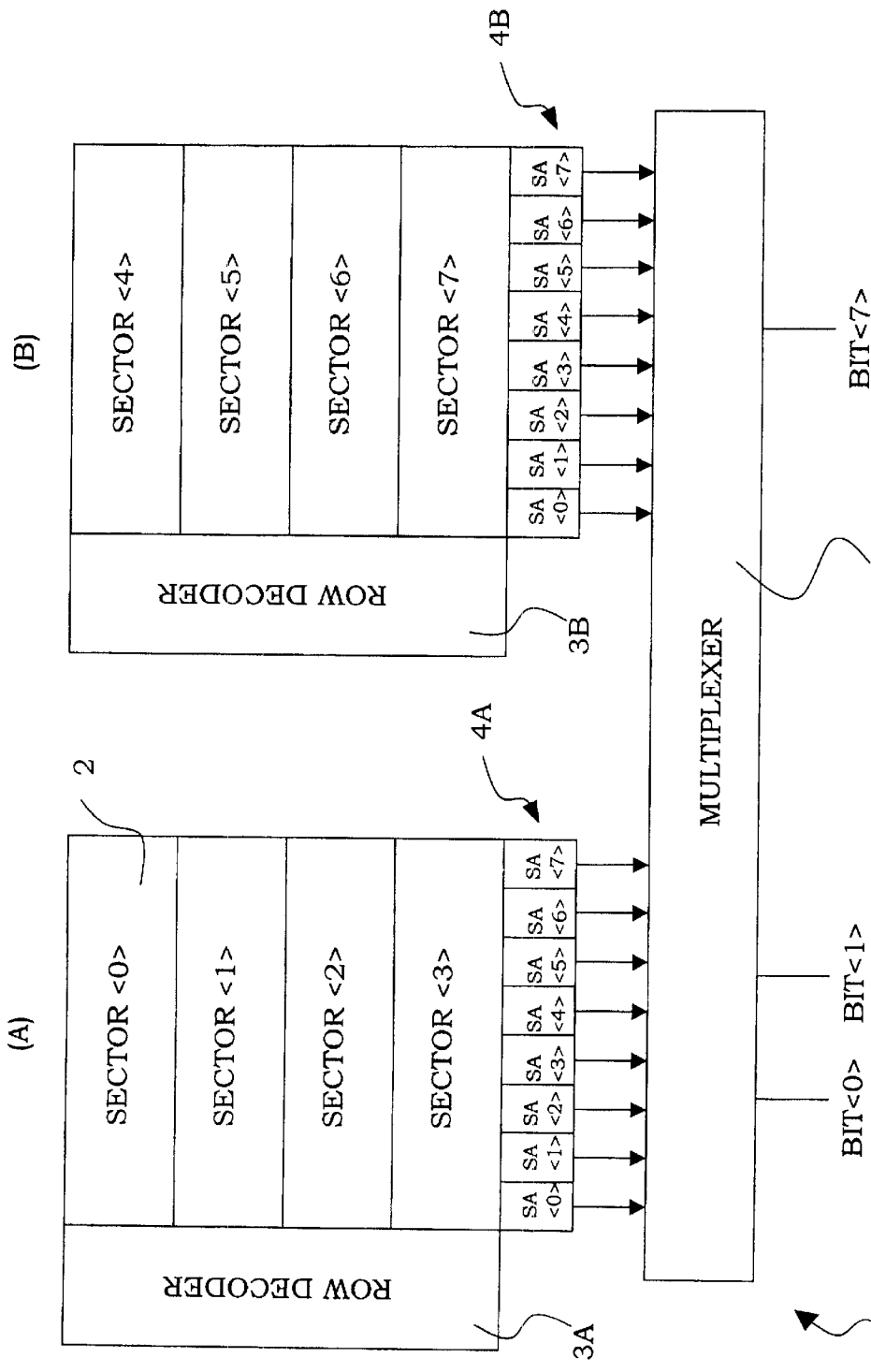
FIG. 3 shows schematically a non-volatile memory architecture, according to the prior art.
Figure 4:
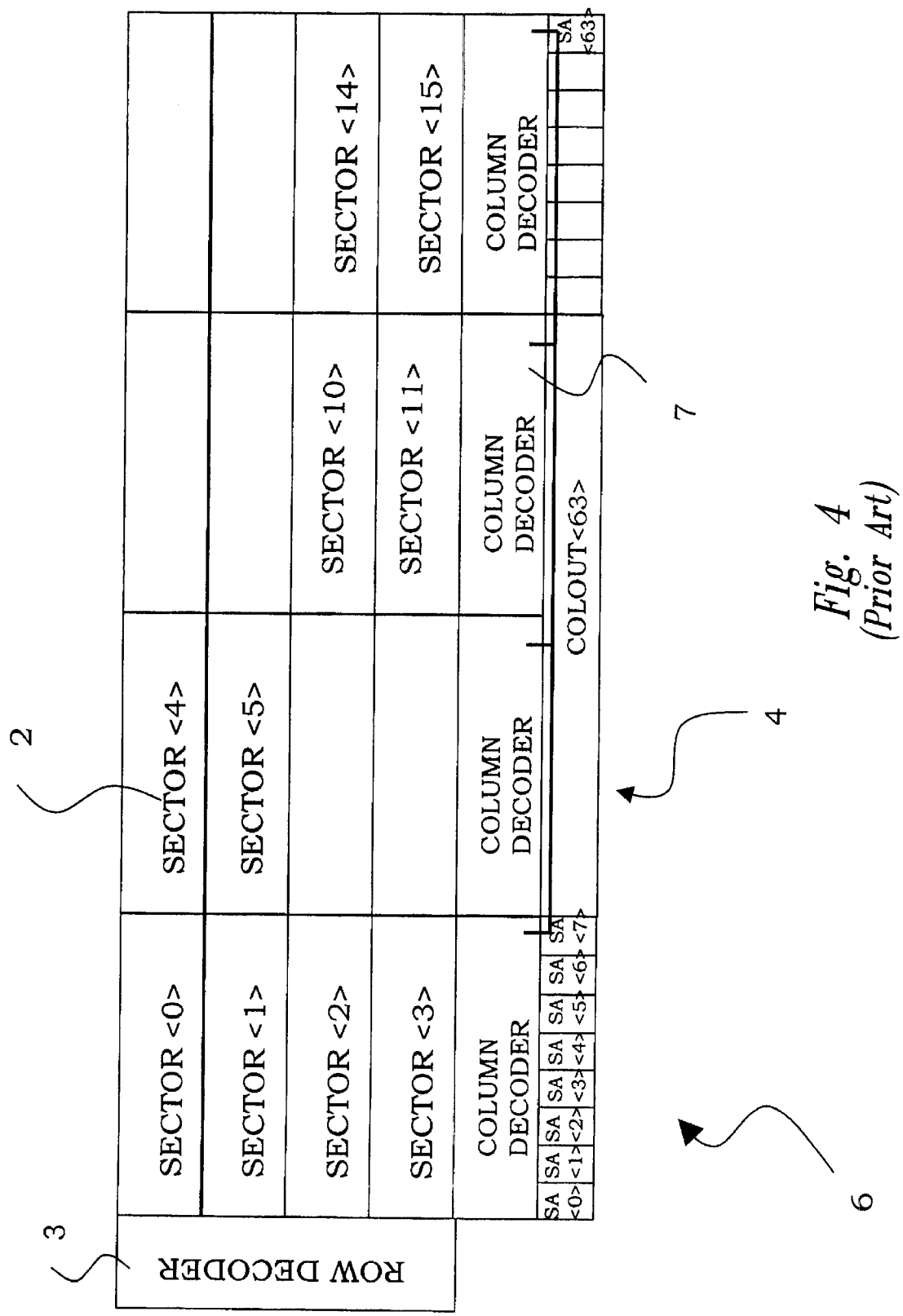
FIG. 4 shows schematically a non-volatile memory architecture for high-parallelism devices, according to the prior art.
Figure 5:
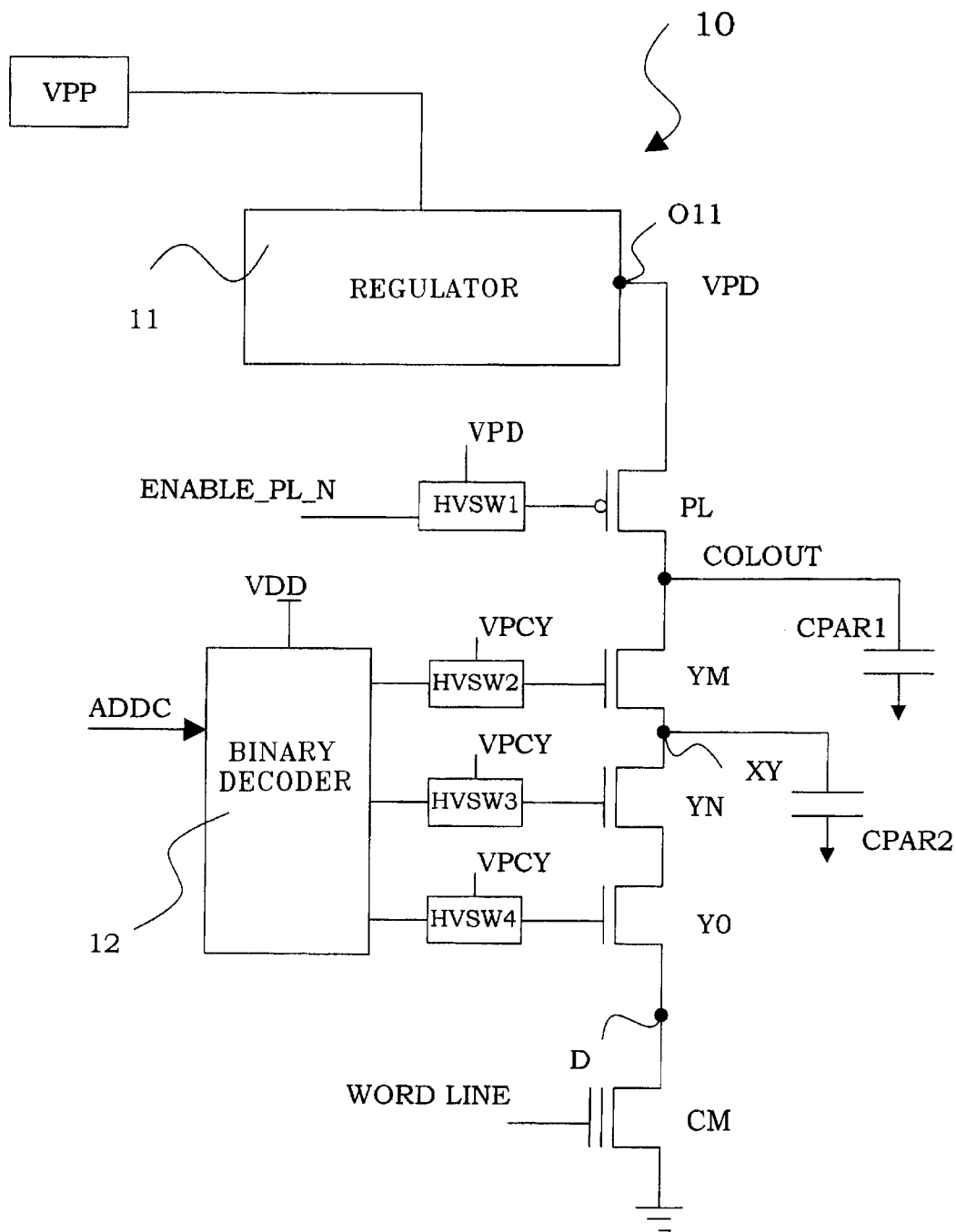
FIG. 5 shows schematically a bias circuit for the drain terminal of a non-volatile memory cell, as incorporated in a memory architecture according to the prior art.
Figure 6:
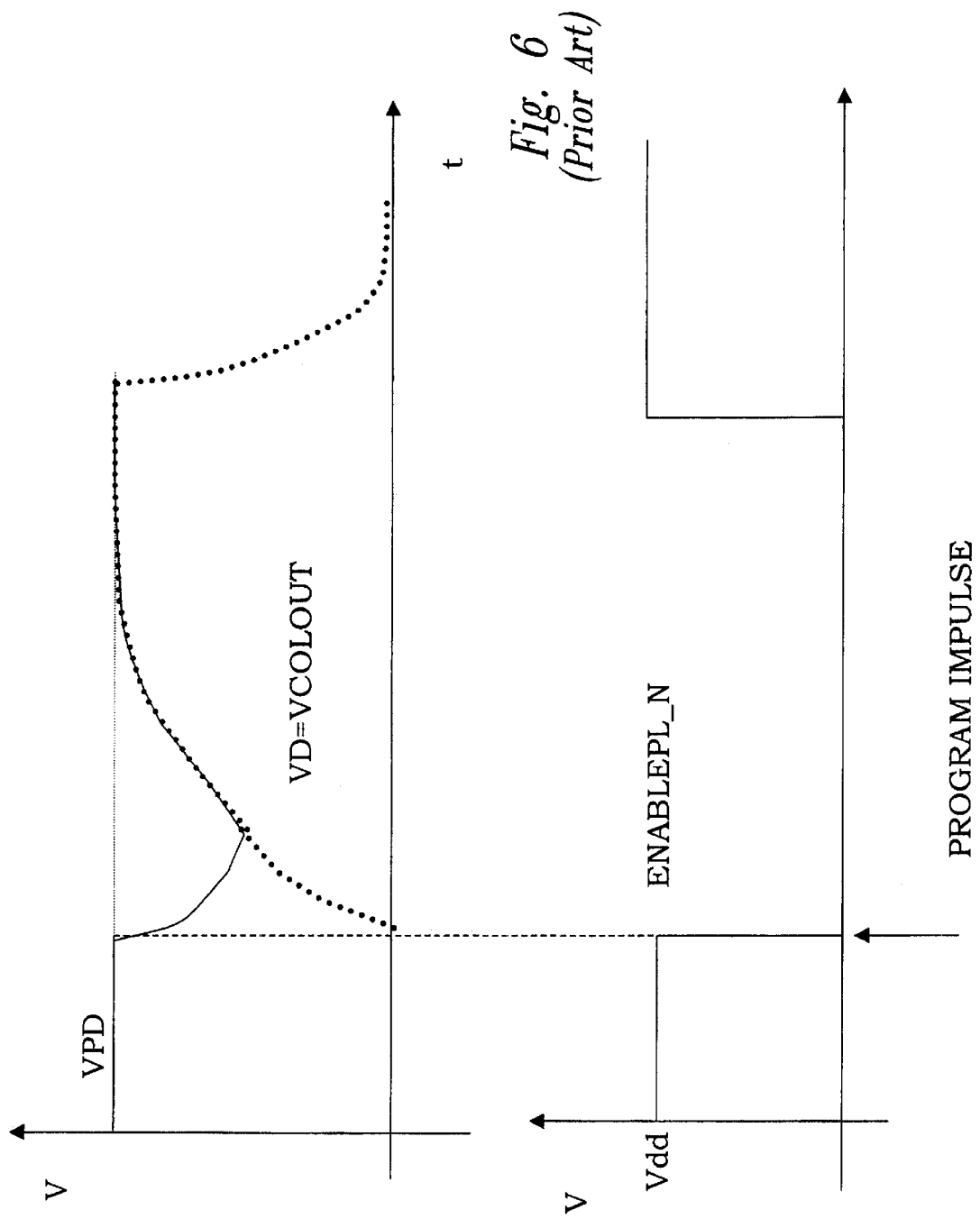
FIG. 6 shows schematically the patterns of internal signals of the circuit of FIG. 5.

Many elements of this bias circuit 13 are identical with those of the conventional bias circuit 10 shown in FIG. 6. Accordingly, construction- and function-wise similar elements are denoted by the same reference numerals for simplicity.

In particular, the bias circuit 13 comprises a series of first PL, second YM, third YN and fourth YO MOS selection transistors connected between a regulated voltage reference VPD and the drain D of a memory cell CM to be programmed.

In particular, the first transistor PL is a P-channel MOS transistor having its source terminal connected to the regulated voltage reference VPD and its drain terminal connected to a line COLOUT, corresponding to the column decoders of the memory device incorporating the bias circuit 13, and represented here by its capacitive load CPAR1 connected to ground. The first transistor PL is a selection transistor having its gate terminal connected to the output of a first high-voltage switch HVSW1 that is fed by the regulated voltage reference VPD and receives as input an enable signal ENABLE_PL_N.

The other transistors YM, YN and YO are hierarchic decoder transistors, and have their gate terminals connected to corresponding high-voltage switches HVSW2, HVSW3 and HVSW4, respectively. These switches receive a regulated decoder voltage supply VPCY and are each input connected to corresponding outputs of a binary decoder 12. The hierarchic decoder is represented here by its capacitive load CPAR2, which is connected between a circuit node XY, intermediate the decoder transistors YM and YN, and ground GND.

The high-voltage switches HVSW2, HVSW3, HVSW4 are usually referred to as the drivers of the respective hierarchic decoder transistors YM, YN, YO.

The binary decoder 12 is fed by a rated supply voltage VDD of the memory device, and receives as input the column addresses ADDC of the data to be programmed.

Advantageously, the bias circuit 13 includes a precharge circuit 14 connected between the binary decoder 12 and the enable switch HWSW2 of the first hierarchic decoder transistor YM.

In particular, the precharge circuit 14 comprises a logic gate, for instance a NOR gate 15, having a first input terminal connected to an input terminal INYM of the precharge circuit 14 and receiving a precharge signal YMTO0, a second input terminal coupled to the binary decoder 12 through another gate, for instance a logic inverter 16, and an output terminal connected to the driver HWSW2 of the first hierarchic decoder transistor YM.

It is understood that the precharge circuit 14 may be obtained using a different or more complicated combination of logic elements, so long as its aptitude to output a voltage signal against the input signal YMTO0 is preserved.

The bias circuit 13 is used to implement a pulse programming method that comprises the following steps:
1. addressing rows and columns to be programmed by selecting the hierarchic decoder transistors YM, YN and YO to bring the supply voltage VPCY of their drivers to the same value as the supply voltage VDD (VPCY=VDD);
2. applying the desired gate voltage and concurrently raising the voltage VPCY to a high voltage value HV;
3. turning off the first addressed ones of the hierarchic decoder transistors YM to bring the precharge signal YMTO0 to a high value, and concurrently
4. turning on the Program Load transistors PL to bring the enable signal ENABLE_PL_N to a low logic value, thereby charging the parasitic capacitance CPAR1 associated with the lines COLOUT;
5. waiting a predetermined length of time, being the time required to let the regulated voltage VPD steady itself;
6. bringing the precharge signal YMTO0 to a low value such that the column decoder can address the desired locations by turning on appropriate hierarchic decoder transistors YM, and initiating the program pulse;
7. turning off the program load transistors PL to bring the enable signal ENABLE_PL_N to a high, and terminating the program pulse.

With the programming method just described, the parasitic capacitance of the lines COLOUT is forced to function as a buffer capacitor for the regulator of the regulated voltage VPD. In other words, the charge stored into the parasitic capacitance CPAR1 is utilized to supply the current needed during the rising edge of the program pulse.

At the same time, the switch HWSW2 of the first hierarchic decoder transistor YM of the column decoder switches at a high voltage and low consumption.

The drivers HWSW2, which drive the first transistors YM of the column decoder and are supplied a voltage VPCY, for instance 10 V, deserve closer attention. They are to switch while being supplied a voltage VDD of about 3 V (VPCY>>VDD).

One embodiment of drivers HWSW2 for the first transistors YM of the column decoder is described in U.S. Pat. No. 6,018,255, granted to Campardo et al. on Jan. 25, 2000, which is hereby incorporated by reference in its entirety.

The driver of that patent produces no appreciable drop of the voltage VPCY upon switching, any variation in the voltage VPCY causing an undesired variation in the conductivity of the corresponding transistor YM, and therefore, in the drain voltage of the memory cell, for a given regulated voltage VPD dictated by the drain regulator.

No problems are encountered with the other hierarchic decoder transistors YN and YO, because they are switched at a voltage VPCY which is same as the supply voltage VDD.

Figure 8:
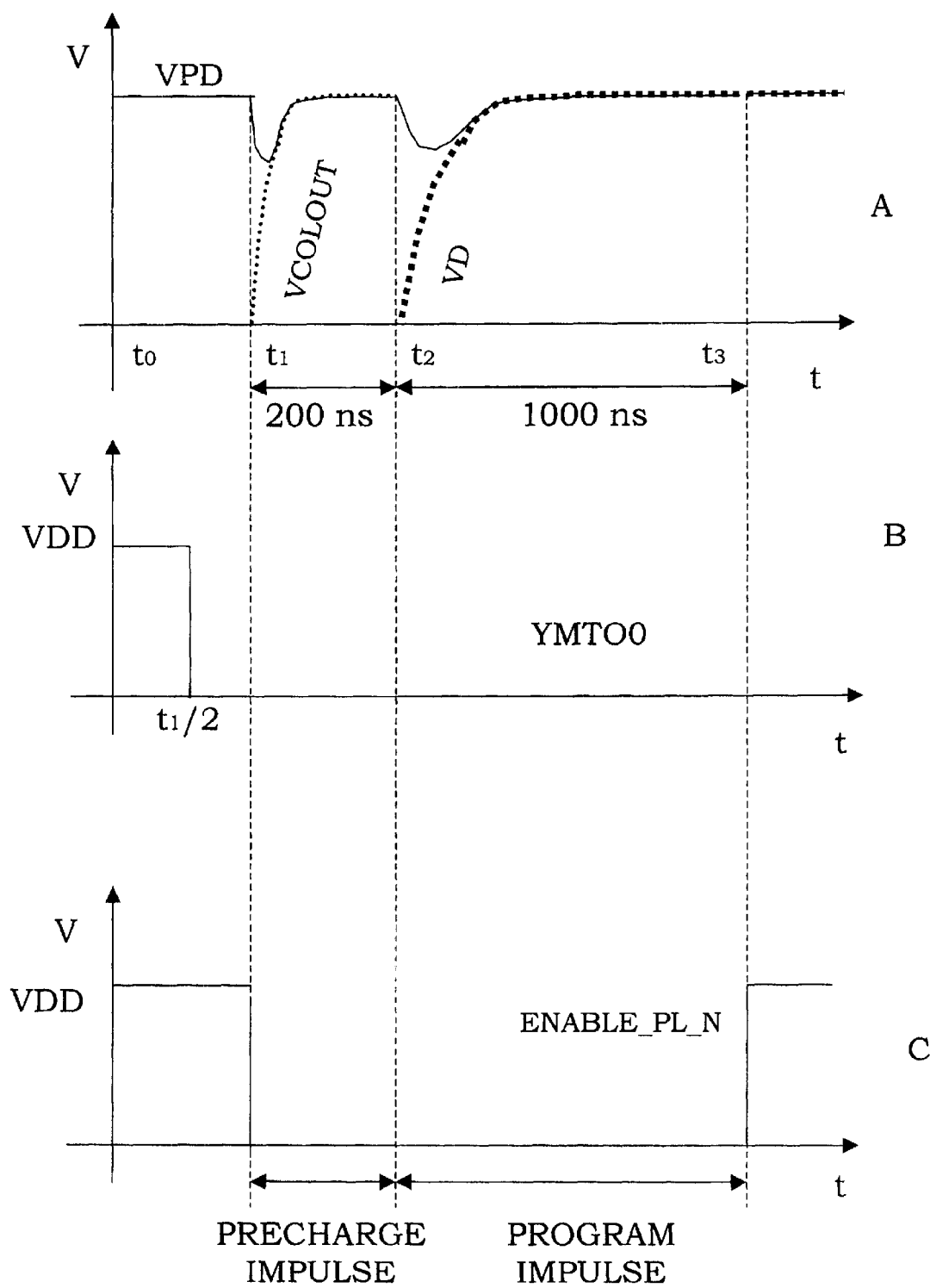
FIG. 8 shows schematically the patterns of internal signals of the circuit of FIG. 7.

FIG. 8 shows the patterns of the voltage signals at the node COLOUT and the drain terminal D of the memory cell being programmed, when the programming method and the bias circuit 13 of this invention are used.

It can be readily seen that, advantageously, the drain terminals D of the cells to be programmed are brought to the desired value of the regulated voltage VPD irrespective of the number of cells to be programmed, thereby overcoming the limitations of prior art circuits.

Also, with the proposed solution, the definition of the program pulse is greatly improved by that the recovery of voltage regulator VPD is much faster, due to the following factors:
less current is drawn at the start of the program pulse because the parasitic capacitance CPAR1 is already charged;
the parasitic capacitance CPAR1 associated with the lines COLOUT, being already charged, also functions as a filter and assists in sustaining the output from the regulator of the regulated voltage VPD.

Finally, notice that in the programming method of this embodiment of the invention, where the lines COLOUT are precharged, the capacitive charge current that is required at the start of the program pulse is only due to contributions from the parasitic capacitance CPAR2 of the bitlines proper.

In other words, the contribution from the routing between the column decoders and the sense amplifiers associated with them is canceled when the lines COLOUT are precharged, so that the problem of defining the program pulse is made independent of the size and the degree of parallelism of the device.

In essence, the programming method with precharging according to this embodiment of the invention does solve the problem of defining the program pulse in the presence of high capacitive loads, and the solution can be applied not only to two- and multilevel memories with high programming parallelism but also to all those cases where the programmed cells are few but the capacitive loads high, or where the voltage pulse that the cells are to see on their drain terminals demands very accurate definition.

The programming method can be used to advantage with large capacity memory devices arranged to perform special functions (such as the so-called burst or page modes) and incorporating a large number of distributed sense amplifiers shared by the whole memory array, so that they are bound to have very long bit-lines burdening the structure with significant parasitic capacitance.

Advantageously in this method, it is further possible to obtain a programming time per byte adequate to allow several cells to be programmed in parallel.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims and the equivalents thereof.

We claim:

1. A pulse programming method for a non-volatile memory device, comprising the steps of:
    addressing memory cells to be programmed in said device by selecting a corresponding program load transistor and a series of hierarchic decoder transistors of a bias circuit;
    biasing gate terminals of said memory cells;
    precharging an internal node of said bias circuit connected to a parasitic capacitance of said memory device; and
    programming said addressed memory cells by applying a regulated voltage pulse to drain terminals of said memory cells.

2. A pulse programming method according to claim 1, wherein said precharging step comprises:
    turning off a first hierarchic decoder transistors by a precharge signal and subsequently turning on said program load transistors of said bias circuit by an enable signal, thus enabling a conduction pattern and allowing said parasitic capacitance to be charged.

3. A pulse programming method according to claim 2, wherein said precharging step comprises a waiting time for said regulated voltage pulse to be stabilized before starting said programming step.

4. A pulse programming method for a non-volatile memory device, comprising the steps of:
    enabling a bias circuit including a drain voltage regulator having an output coupled to drain terminals of memory cells to be programmed in said memory device;
    addressing the memory cells to be programmed in said memory device by selecting corresponding hierarchic decoder transistors of said bias circuit;
    biasing gate terminals of said memory cells;
    precharging a parasitic capacitance connected to at least one of said hierarchic decoder transistors of said bias circuit; and
    programming said memory cells by applying a voltage pulse to the drain terminals of said memory cells.

5. A pulse programming method according to claim 4, wherein said precharging step comprises:
    turning off said hierarchic decoder transistors by a precharge signal and subsequently turning on said program load transistors of said bias circuit by an enable signal thus allowing said parasitic capacitance to be charged.

6. A pulse programming method according to claim 5, wherein said precharging step comprises a waiting time for said regulated voltage pulse to be stabilized before starting said programming step.

7. A programming method for a non-volatile memory device, comprising the steps of:
    addressing row and columns to be programmed of a matrix of memory cells in said memory device by selecting a corresponding program load transistor and hierarchic transistors in a bias circuit;
    biasing gate terminals of said memory cells;
    precharging a parasitic capacitance, corresponding to a capacitive load of a column decoder, driving said hierarchic transistors; and
    completing a programming phase by applying a voltage pulse to drain terminals of said addressed memory cells.

8. A programming method according to claim 7, wherein said precharging step comprises:
    turning off said hierarchic decoder transistors by a precharge signal and subsequently turning on said program load transistors of said bias circuit by an enable signal thus allowing said parasitic capacitance to be charged.

9. A memory device, comprising:
    a non-volatile memory cell having a drain terminal; and
    a bias circuit for biasing the drain terminal of the memory cell, the bias circuit including:
        a column decoder portion, connected between a regulated voltage reference and said drain terminal, comprising a program load transistor and a series of hierarchic decoder transistors, all said transistors having gate terminals connected to respective drive switches;
        a parasitic capacitance connected to a common node between said program load transistor and a first of said hierarchic decoder transistors in said column decoder portion;
        a binary decoder having a signal input and a plurality of outputs corresponding to the drive switches, respectively; and
        a precharge circuit connected between one output of said binary decoder and said first hierarchic decoder transistor and receiving a suitable precharge signal to start a precharge phase of said parasitic capacitance.

10. A memory device according to claim 9, wherein said precharge circuit comprises at least one logic gate having a first input terminal receiving said precharge signal and a second input terminal coupled to said one output of said binary decoder and an output terminal connected to said drive switch corresponding to said one output of said binary decoder.

11. A memory device according to claim 9, wherein said second input terminal is coupled to said one output of said binary decoder through a logic inverter.

12. A memory device according to claim 9, wherein said precharge signal turns off said first hierarchic decoder transistor before an enable signal turning on said program load transistor, thereby charging said common node connected to said parasitic capacitance.

13. A memory device according to claim 9, wherein said cells are multilevel memory cells.

14. A memory device, comprising:
    a matrix of multilevel memory cells; and
    corresponding row and column decoder circuit portions, each column decoder circuit portion including a bias circuit for biasing a drain terminal of a corresponding one of the memory cells, the bias circuit including:

a drain voltage regulator producing a regulated voltage for a program load transistor and a series of hierarchic decoder transistors, all said transistors having gate terminals connected to respective drive switches;

a parasitic capacitance connected to a common node between said program load transistor and a first of said hierarchic decoder transistors in said column decoder portion;

a binary decoder receiving as power supply said regulated voltage and having a signal input and a plurality of outputs corresponding to the drive switches, respectively;

a precharge circuit connected between a first output of said binary decoder and said first hierarchic decoder transistor and receiving a precharge signal to start a precharge phase of said parasitic capacitance.

15. A memory device according to claim 14, wherein said precharge circuit comprises at least one logic gate having a first input terminal receiving said precharge signal and a second input terminal coupled to said first output of said binary decoder and an output terminal connected to said drive switch corresponding to said first output.

16. A memory device according to claim 14, wherein said logic gate is a NOR gate and said second input terminal is coupled to said first output of said binary decoder through a logic inverter.

17. A memory device according to claim 14, wherein said precharge signal turns off said first hierarchic decoder transistor before an enable signal turning on said program load transistor, thereby charging said common node connected to said parasitic capacitance.

18. A memory device according to claim 14, wherein said cells are non-volatile Flash memory cells.

* * * * *